(12) United States Patent
Morishita et al.

(10) Patent No.: US 12,217,928 B2
(45) Date of Patent: Feb. 4, 2025

(54) ELECTRON GUN AND ELECTRON MICROSCOPE

(71) Applicant: Hitachi High-Tech Corporation, Tokyo (JP)

(72) Inventors: Hideo Morishita, Tokyo (JP); Takashi Ohshima, Tokyo (JP); Tatsuro Ide, Tokyo (JP); Naohiro Kohmu, Tokyo (JP); Toshihide Agemura, Tokyo (JP); Yoichi Ose, Tokyo (JP); Junichi Katane, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 288 days.

(21) Appl. No.: 17/798,092

(22) PCT Filed: Mar. 25, 2020

(86) PCT No.: PCT/JP2020/013195
§ 371 (c)(1),
(2) Date: Aug. 8, 2022

(87) PCT Pub. No.: WO2021/192070
PCT Pub. Date: Sep. 30, 2021

(65) Prior Publication Data
US 2022/0406558 A1 Dec. 22, 2022

(51) Int. Cl.
*H01J 37/073* (2006.01)
*H01J 1/34* (2006.01)

(52) U.S. Cl.
CPC .............. *H01J 37/073* (2013.01); *H01J 1/34* (2013.01); *H01J 2237/053* (2013.01);
(Continued)

(58) Field of Classification Search
CPC ...... H01J 1/34; H01J 37/073; H01J 2237/053; H01J 2237/055; H01J 2237/06333; H01J 2237/188; H01J 2237/24557
See application file for complete search history.

(56) References Cited

U.S. PATENT DOCUMENTS

| 5,684,360 A | 11/1997 | Baum et al. |
| 2003/0131795 A1 | 7/2003 | Karasawa et al. |

FOREIGN PATENT DOCUMENTS

| JP | 11-509360 A | 8/1999 |
| JP | 2000-123716 A | 4/2000 |

(Continued)

OTHER PUBLICATIONS

International Search Report of PCT/JP2020/013195 dated Jun. 2, 2020.

*Primary Examiner* — Mark R Gaworecki
(74) *Attorney, Agent, or Firm* — MATTINGLY & MALUR, PC

(57) ABSTRACT

The electron gun is provided with a first anode electrode and a second anode electrode to generate an acceleration and deceleration electric field. A lens electric field makes it possible to irradiate a sample with an electron beam emitted from a part outside an optical axis of the photoelectric film without being blocked by a differential exhaust diaphragm. A wide range of electron beams off-optical axis can be used even in a high-brightness photocathode that requires high vacuum. As a result, the photoelectric film and the electron gun can be extended in life, can be stabilized, and can be increased in brightness. Further, it is possible to facilitate a control of emitting electron beams from a plurality of positions on the photoelectric film, a timing control of emitting electron beams from a plurality of positions, a condition control of an electron beam in an electron microscope using electron beams.

14 Claims, 11 Drawing Sheets

(52) U.S. Cl.
CPC ............... *H01J 2237/055* (2013.01); *H01J 2237/06333* (2013.01); *H01J 2237/188* (2013.01); *H01J 2237/24557* (2013.01)

(56) References Cited

FOREIGN PATENT DOCUMENTS

| | | |
|---|---|---|
| JP | 2001-143648 A | 5/2001 |
| JP | 2002-243898 A | 8/2002 |
| JP | 2004-506296 A | 2/2004 |
| JP | 2010-218868 A | 9/2010 |
| JP | 2015-204404 A | 11/2015 |
| WO | 2002/013226 A2 | 2/2002 |

[FIG. 1]
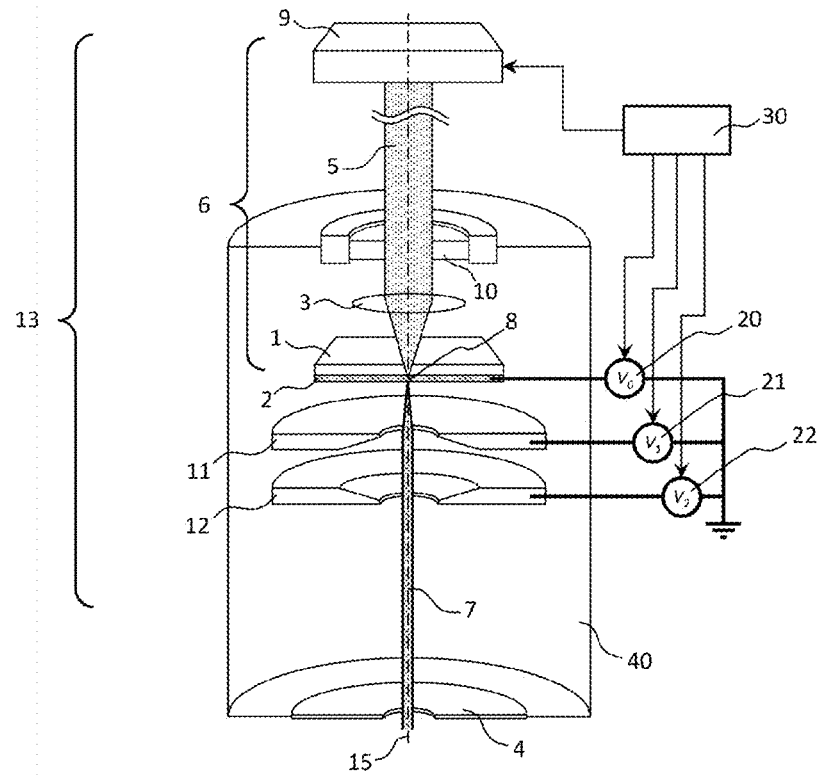
[FIG. 2]
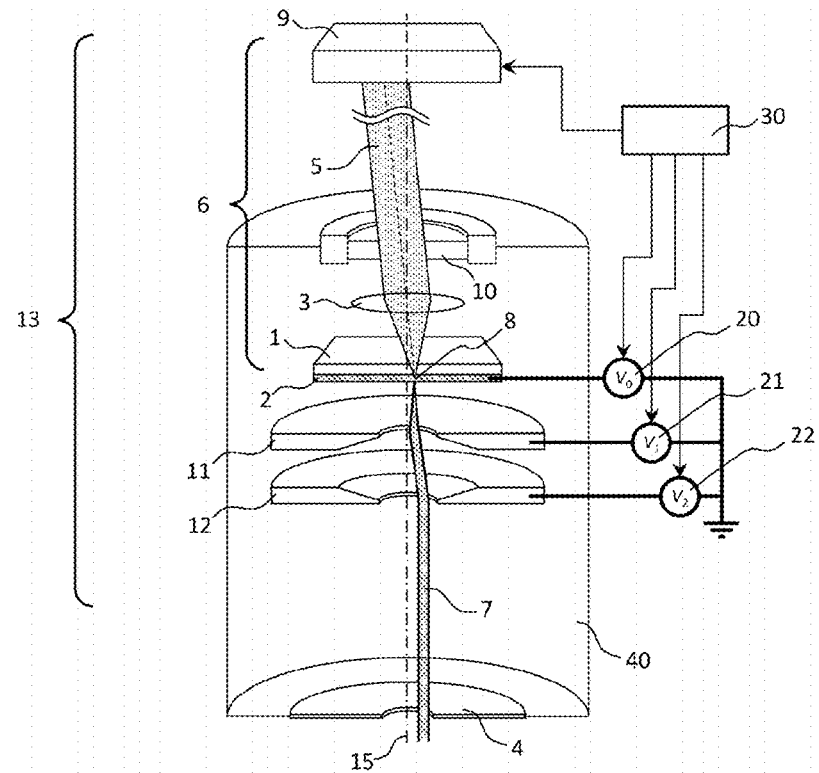

[FIG. 3]
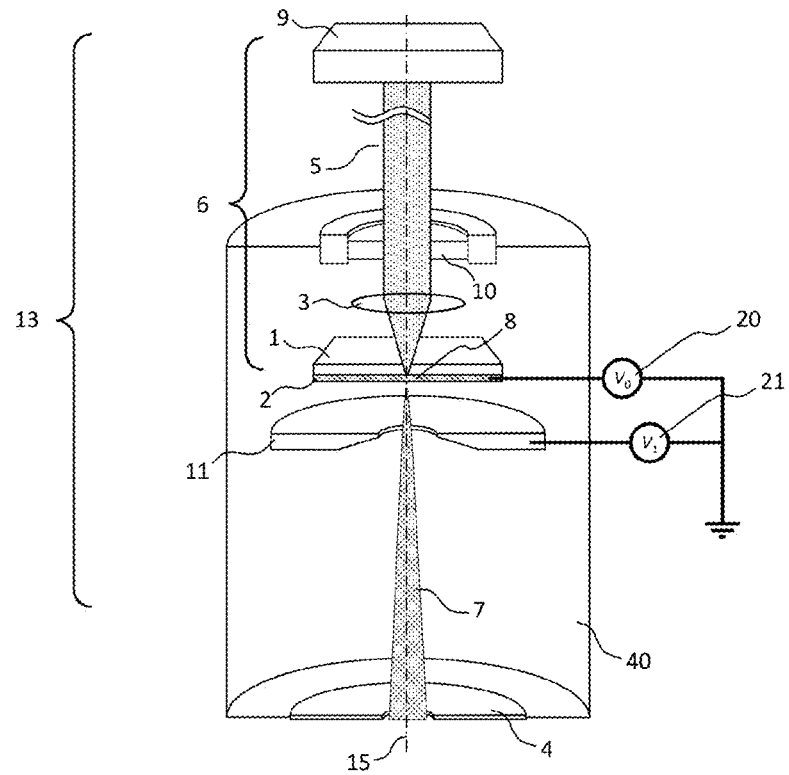
[FIG. 4]
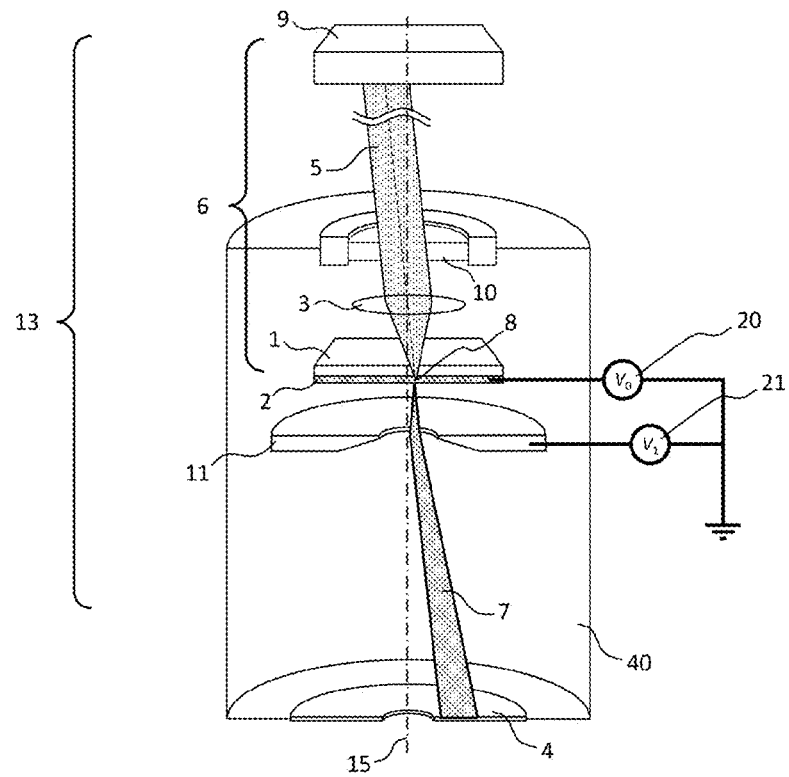

[FIG. 5]
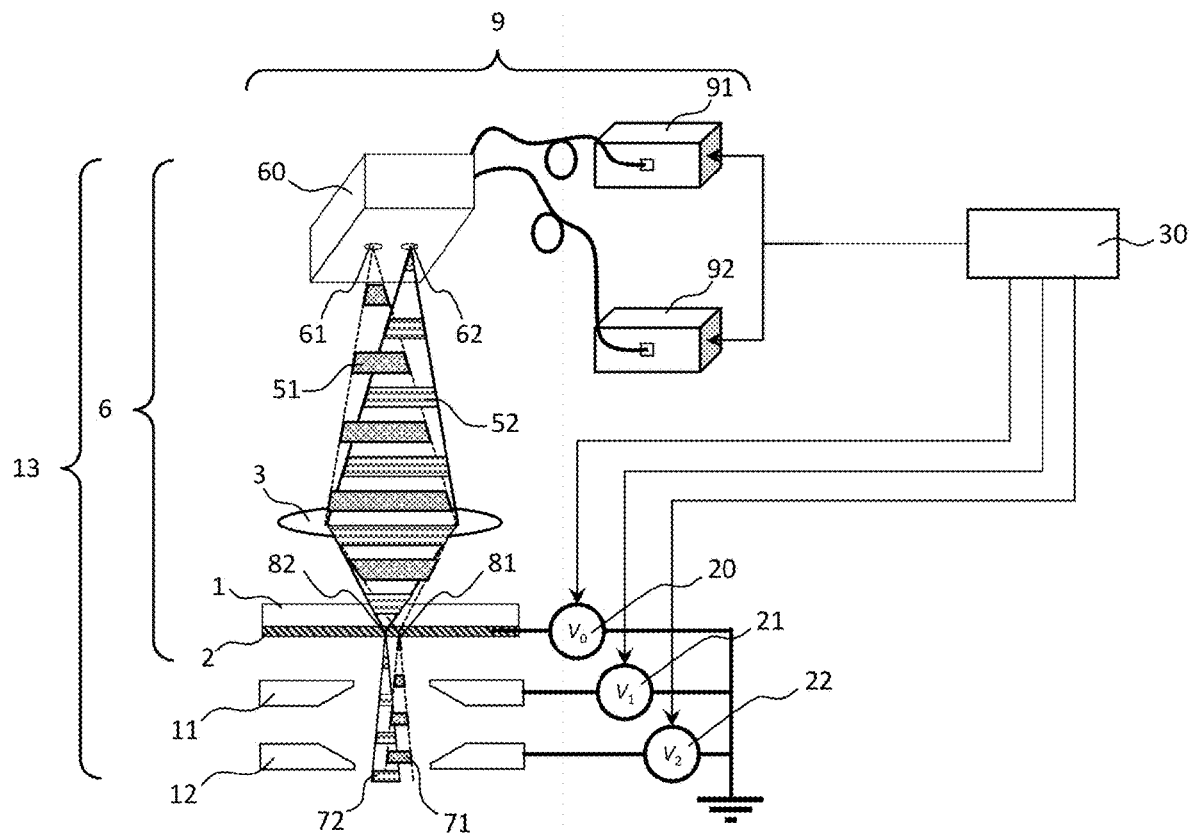
[FIG. 6]
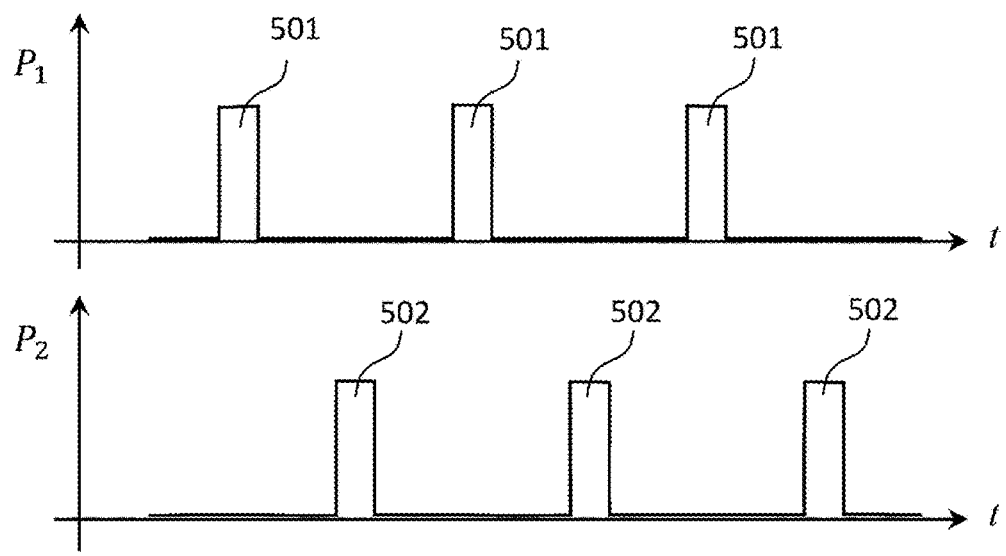

[FIG. 7]
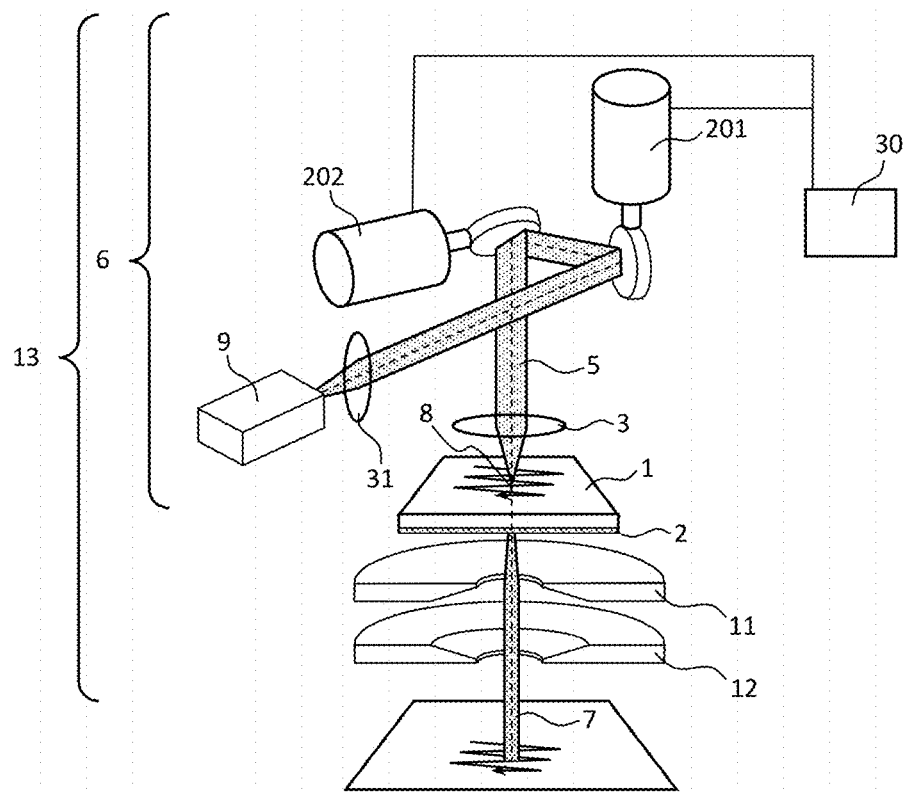
[FIG. 8]
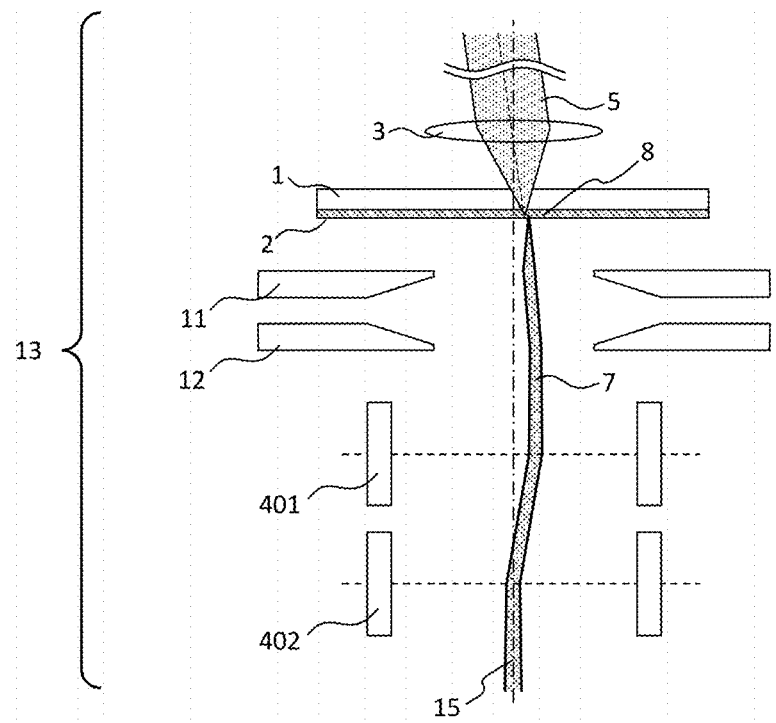

[FIG. 9]
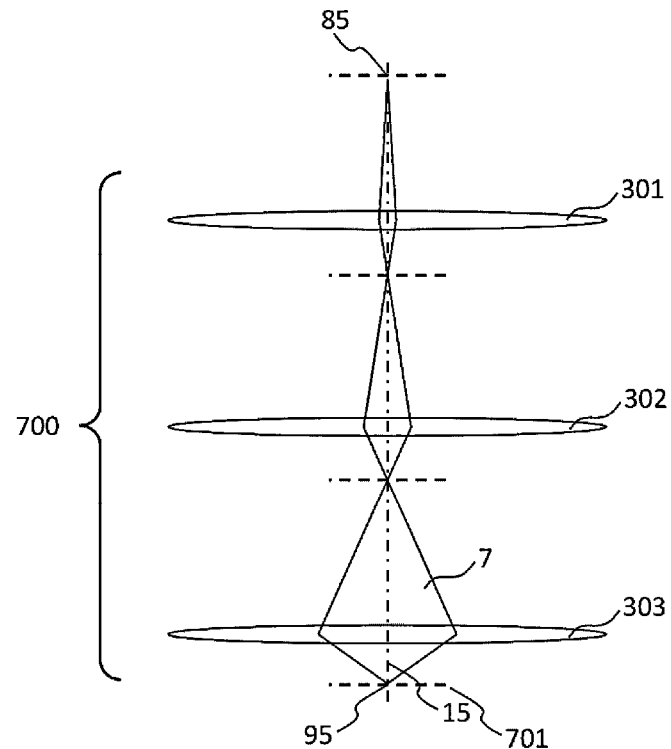
[FIG. 10]
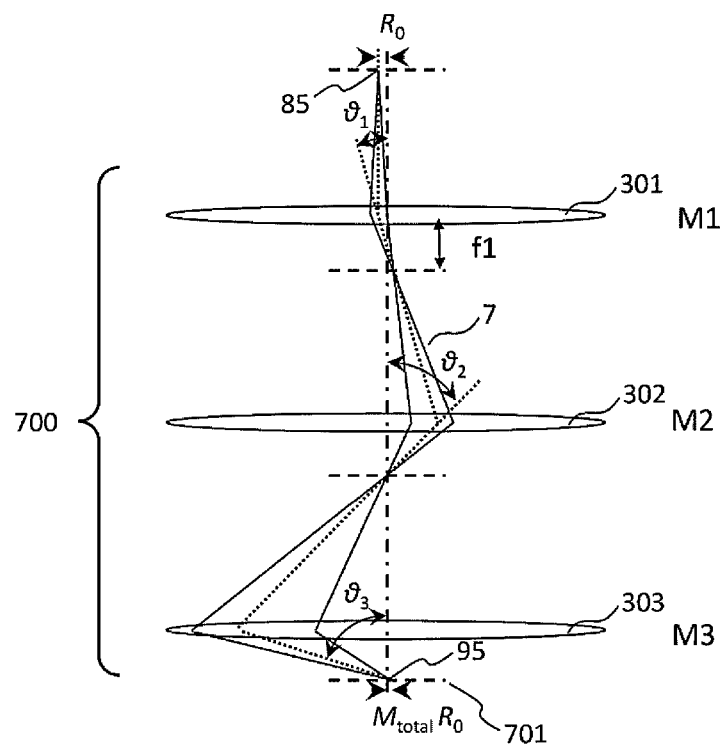

[FIG. 11]
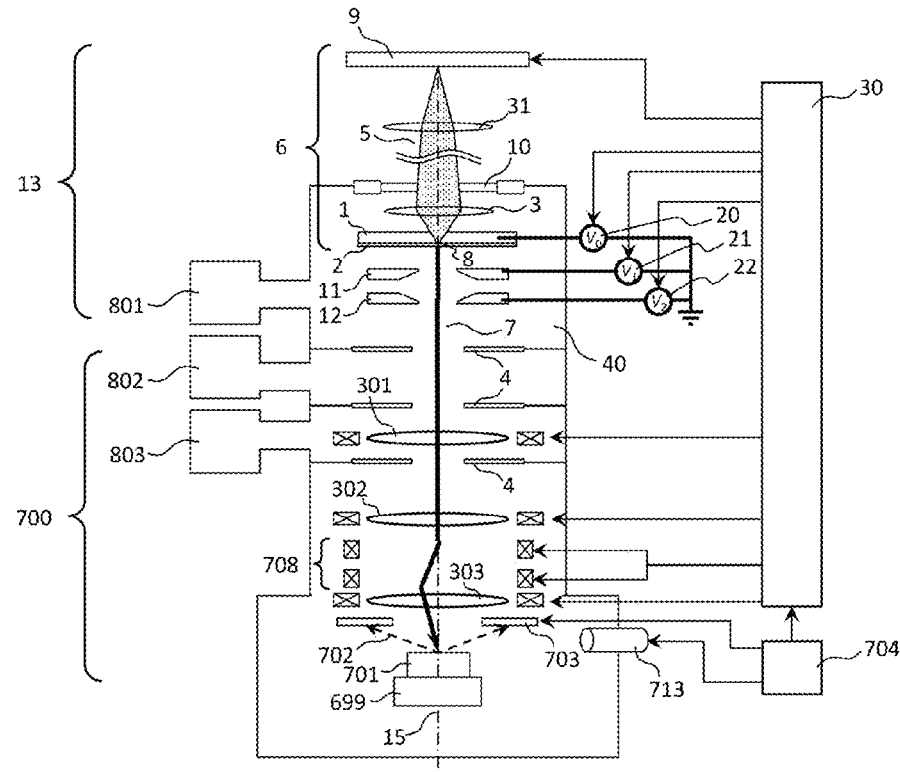
[FIG. 12]
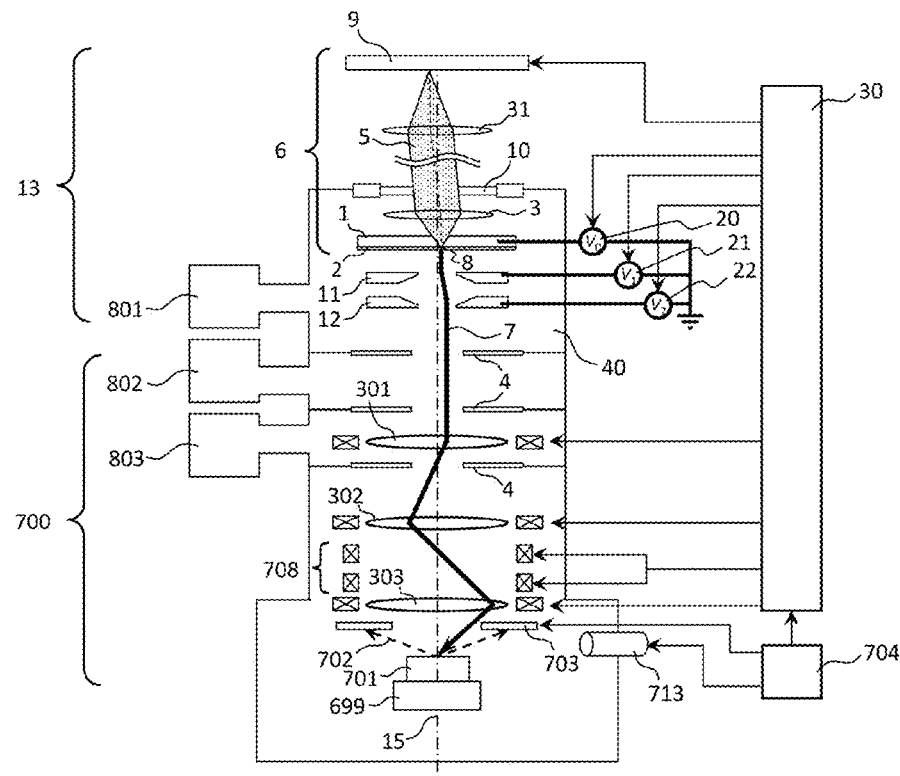

[FIG. 13A]
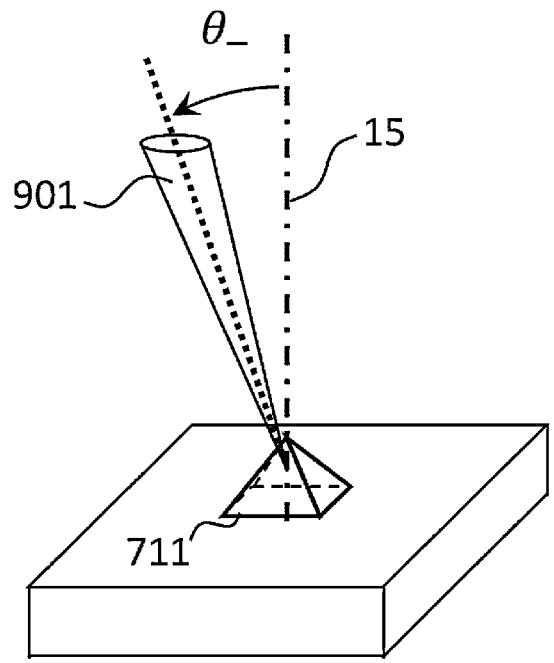
[FIG. 13B]
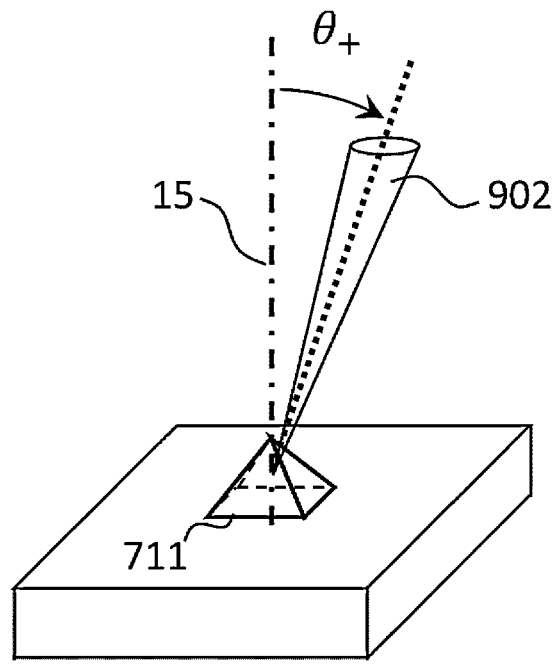

[FIG. 14A]
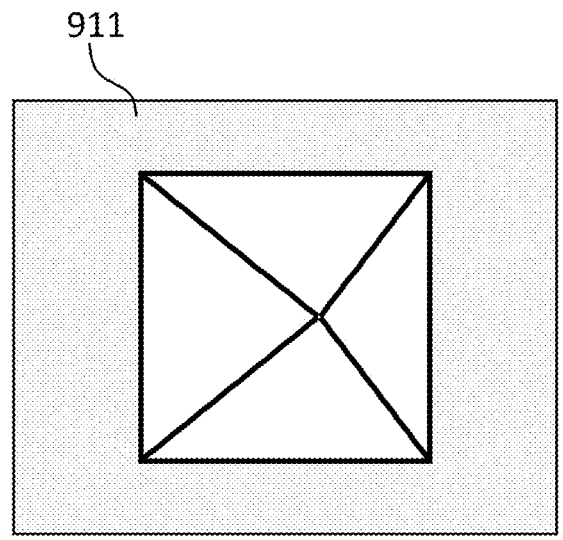
[FIG. 14B]
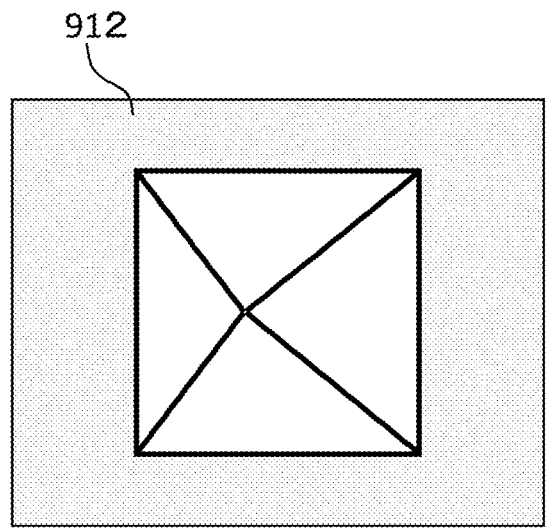

[FIG. 15]
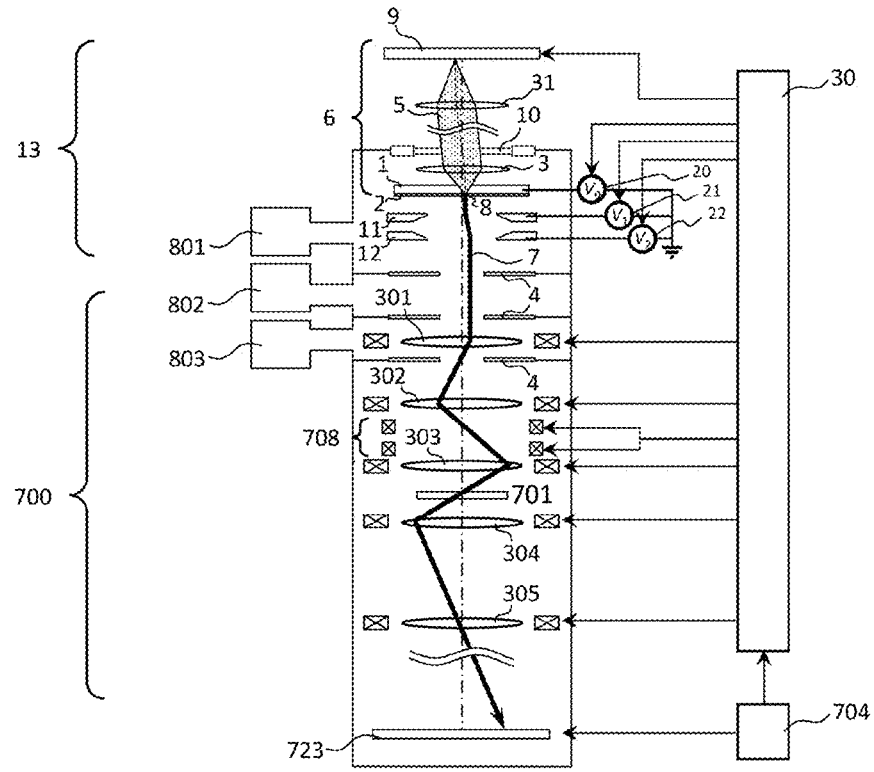
[FIG. 16]
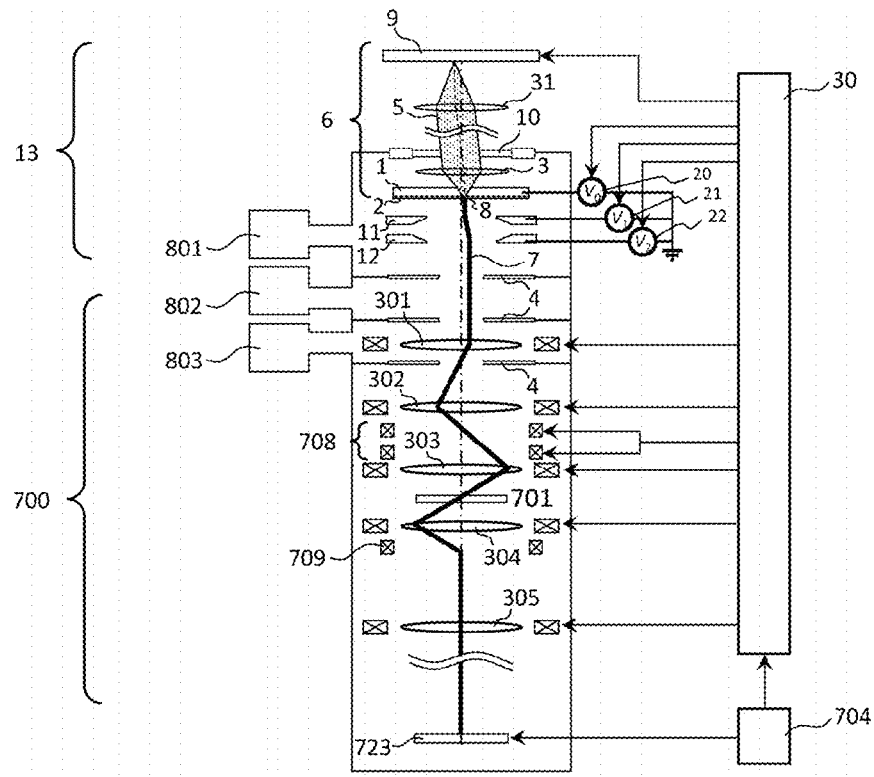

[FIG. 17]
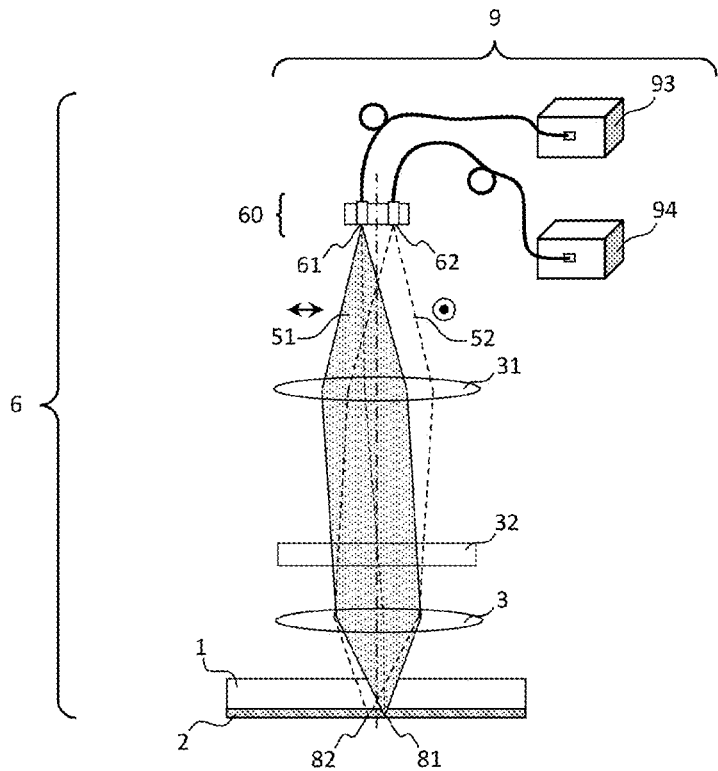
[FIG. 18]
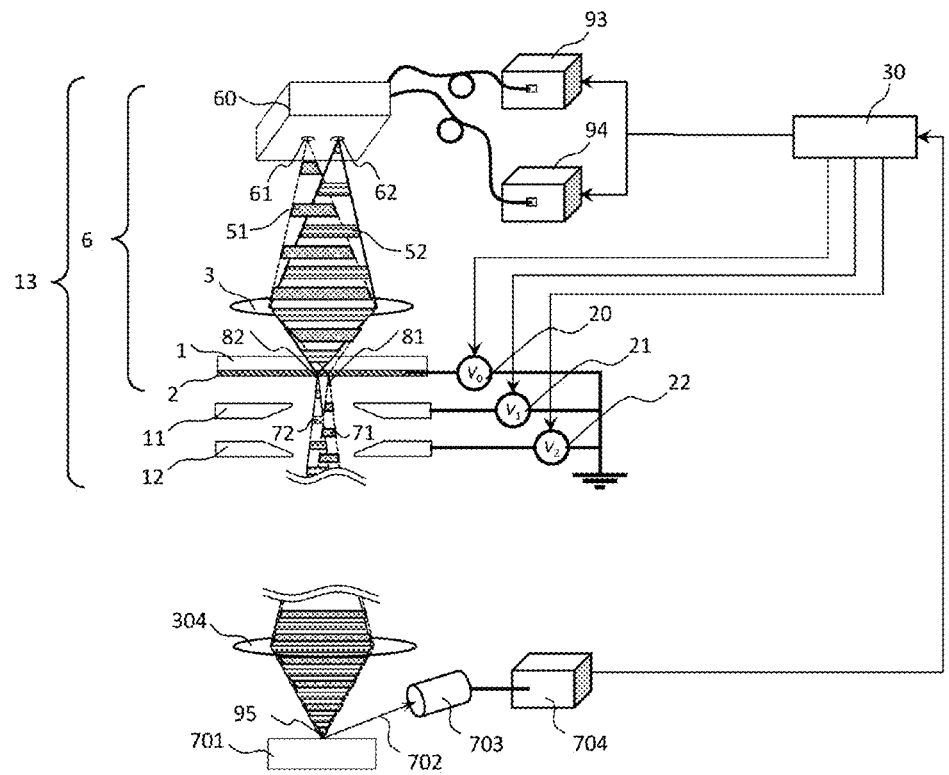

[FIG. 19]
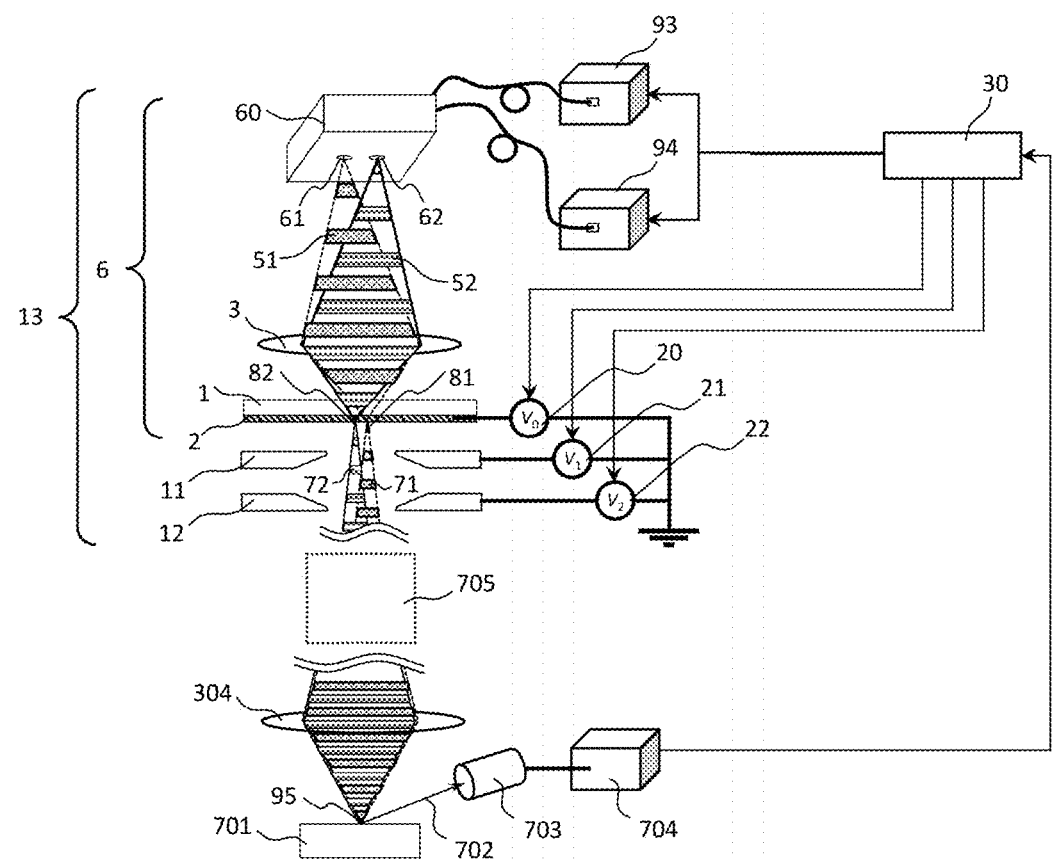

ELECTRON GUN AND ELECTRON MICROSCOPE

TECHNICAL FIELD

The present invention relates to a photoexcitation electron gun using a photocathode and an electron beam application device such as an electron microscope using the electron gun.

BACKGROUND ART

Electron microscopes for observing a fine region in an enlarged manner by irradiating a sample with an electron beam are roughly classified into two types: a transmission electron microscope (TEM) and a scanning electron microscope (SEM). In the former TEM, parallel and uniform electron beams are emitted to a sliced sample under a high acceleration condition of an acceleration voltage of 100 kV or more, and electron beams scattered when passing through the sample are imaged to obtain a TEM image. In order to obtain high resolution by the TEM, it is important that parallelism of the electron beams emitted to the sample is ensured and a current density of the electron beams emitted to the sample is large. On the other hand, in the latter SEM, a sample is two-dimensionally scanned with an electron beam converged on a surface of a bulk sample at an acceleration voltage of 30 kV or less, and a signal electron intensity of each irradiation point is displayed to obtain an SEM image. In order to obtain high resolution by the SEM, a large current density is required under a condition in which an irradiation opening angle of the electron beam to the sample is optimal. As described above, in order to obtain a high-resolution TEM image or SEM image, an electron source having a large current density, that is, high brightness is essential.

In an electron microscope in the related art, an electric field emission electron source of a Schottky emission (SE) type or a cold field emission (CFE) type in which a strong electric field is applied to a tip end of an electrode sharpened into a needle shape is used as a high-brightness electron source. In such an electron source, since an electron emission region is limited to a tip end portion of a needle-shaped electrode, a virtual light source diameter is small, and thus high brightness is obtained. In general, diameters of virtual light sources of the SE electron source and the CFE electron source are as small as several nm to several tens of nm, and converted brightness of the virtual light sources is larger than $1 \times 10^7$ A/sr/m²/V. As compared with the SE electron source and the CFE electron source, a photoexcitation electron source using a semiconductor photocathode whose surface has negative electron affinity (NEA) is a planar electron source. A virtual light source has a large diameter of φ1 μm which is about the same as a spot diameter of excitation light, an angle range of electrons emitted from the NEA surface is extremely small and is about 10 degrees or less. Therefore, maximum converted brightness of an electron source using the high brightness NEA photocathode is $1 \times 10^7$ A/sr/m²/V, and the electron source has a high brightness characteristic equivalent to that of the SE electron source and the CFE electron source.

An application technique of the electron source that has high brightness and uses the NEA photocathode as described above is disclosed in detail in PTL 1. A technique for multiplexing an electron emission source by providing a plurality of excitation points on a photocathode is disclosed in PTL 2 and PTL 3.

CITATION LIST

Patent Literature

PTL 1: JP-A-2001-143648
PTL 2: JP-A-2004-506296
PTL 3: JP-A-2000-123716

SUMMARY OF INVENTION

Technical Problem

Since the electron source using the NEA photocathode is a planar electron source, the electron source can be used as an electron source that generate electron beams not only from an optical axis but also from outside of the optical axis to generate multiple beams by providing a plurality of excitation points of light. Various applications can be considered by using the NEA photocathode to effectively use the electron beams emitted not only from the optical axis but also from the outside of the optical axis as probe electron beams of an electron microscope.

On the other hand, in an electron gun and an electron microscope using a photocathode as an electron source, when an electron beam from the outside of the optical axis is used, the electron beam outside the optical axis may be blocked by a differential exhaust diaphragm for appropriately maintaining vacuum of the electron gun and the electron microscope.

Solution to Problem

An electron gun according to an embodiment of the invention includes a photocathode that has a substrate and a photoelectric film formed on the substrate, a condenser lens configured to condense, onto the photoelectric film, excitation light emitted to the photoelectric film of the photocathode, and a first anode electrode and a second anode electrode that are arranged in an order away from the photoelectric film of the photocathode in a direction opposite to the substrate, in which a first voltage that is positive relative to the photoelectric film of the photocathode is applied to the first anode electrode, and a second voltage that is negative relative to the first anode electrode is applied to the second anode electrode.

Advantageous Effects of Invention

A wide region on a photocathode surface can be used as an electron beam source. As a result, a plurality of points on the photocathode can be used as excitation points, that is, electron sources, and various applications can be expected.

Other problems and novel features will become apparent from the description of this specification and the accompanying drawings.

BRIEF DESCRIPTION OF DRAWINGS

FIG. 1 is a schematic diagram showing a configuration of an electron gun and a trajectory of an electron beam according to a first embodiment.

FIG. 2 is a schematic diagram showing the configuration of the electron gun and a trajectory of an electron beam according to the first embodiment.

FIG. 3 is a schematic diagram showing a configuration of an electron gun and a trajectory of an electron beam in the related art.

FIG. 4 is a schematic diagram showing the configuration of the electron gun and a trajectory of an electron beam in the related art.

FIG. 5 is a diagram showing an outline of an electron gun according to a second embodiment.

FIG. 6 is a diagram showing an outline of an excitation light control method according to the second embodiment.

FIG. 7 is a diagram showing an outline of another configuration of the electron gun according to the second embodiment.

FIG. 8 is a diagram showing an outline of an electron gun according to a third embodiment.

FIG. 9 is a schematic diagram showing a trajectory of an electron beam in an SEM.

FIG. 10 is a schematic diagram showing a trajectory of an electron beam in the SEM.

FIG. 11 is a diagram showing an outline of an electron microscope according to a fourth embodiment.

FIG. 12 is a diagram showing an outline of an electron microscope according to a fifth embodiment.

FIG. 13A is a diagram showing an irradiation angle of an electron beam according to the fifth embodiment.

FIG. 13B is a diagram showing an irradiation angle of an electron beam according to the fifth embodiment.

FIG. 14A is a diagram showing an example of an observation image according to the fifth embodiment.

FIG. 14B is a diagram showing an example of an observation image according to the fifth embodiment.

FIG. 15 is a diagram showing an outline of a configuration of an electron microscope according to the fifth embodiment.

FIG. 16 is a diagram showing an outline of a configuration of an electron microscope according to the fifth embodiment.

FIG. 17 is a diagram showing an outline of an excitation optical system according to a sixth embodiment.

FIG. 18 is a diagram showing an outline of an electron microscope according to the sixth embodiment.

FIG. 19 is a diagram showing an outline of an electron microscope according to the sixth embodiment.

DESCRIPTION OF EMBODIMENTS

Hereinafter, embodiments of the present invention will be described in detail with reference to the drawings.

First Embodiment

FIGS. 1 and 2 show a configuration of an electron gun and a trajectory of an electron beam according to the first embodiment. A photocathode having a photoelectric surface that emits electrons by being irradiated with excitation light is used as an electron source. An electron emission portion (surface) of the photocathode is hereinafter referred to as a photoelectric film (surface). A trajectory of an electron beam in FIG. 1 is a trajectory when an excitation point 8 on a photoelectric film 2 is set on an optical axis, and a trajectory of an electron beam in FIG. 2 is a trajectory when the excitation point 8 is set off-optical axis.

In FIGS. 1 and 2, an electron gun 13 includes a transparent substrate 1 constituting a photocathode, the photoelectric film 2 formed on the transparent substrate 1, an excitation optical system 6 that condenses excitation light 5 and emits the excitation light 5 to a plurality of points on the photoelectric film 2, and a first anode electrode 11 and a second anode electrode 12 that allow an electron beam 7 generated from the photoelectric film 2 to pass therethrough. Power supplies 20, 21, and 22 are respectively connected to the photoelectric film 2, the first anode electrode 11, and the second anode electrode, and voltages $V_0$, $V_1$, and $V_2$ are respectively applied to the photoelectric film 2, the first anode electrode 11, and the second anode electrode. A control unit 30 may be provided to control and adjust these voltages. Although the power supplies 20 to 22 are arranged in parallel in the drawing, it is also possible to connect at least a part of the power supplies 20 to 22 in series so as to apply one of the voltages $V_0$, $V_1$, and $V_2$ as a basic voltage and apply the other voltages as a voltage different from the basic voltage. The photoelectric film 2 is disposed in a vacuum chamber 40, and a differential exhaust diaphragm 4 for maintaining a periphery of the photoelectric film in extremely high vacuum is disposed in the vacuum chamber 40. Although not shown, the vacuum chamber 40 is maintained in extremely high vacuum by an evacuation facility. An ion pump, a non-evaporable getter (NEG) pump, or the like can be used as the evacuation facility.

The excitation optical system 6 includes an excitation light source 9, a viewing port 10, and a condenser lens 3. The photoelectric film 2 and the condenser lens 3 are disposed in the vacuum chamber 40, the excitation light 5 is generated from the excitation light source 9 disposed outside the vacuum chamber. The excitation light 5 passes through a window of the viewing port 10, is condensed by the condenser lens 3 disposed in the vicinity of the photoelectric film 2, and is emitted to the excitation point on the photoelectric film 2. The electron beam 7 is emitted from the excitation point 8. As shown in FIG. 1, when the condenser lens 3 is disposed on a side opposite to the photoelectric film 2 relative to the transparent substrate 1, the excitation light 5 can be condensed at a numerical aperture of 0.5 or more. As a result, the excitation light 5 at the excitation point 8 can be condensed to a diffraction limit, so that a virtual light source diameter of the electron source can be reduced and the electron source can be used as a point source. A surface of the photoelectric film 2 is under an NEA condition in which energy at a lower end of a conduction band is higher than a vacuum level. Electrons excited from a valence band to the conduction band by emission of the excitation light are efficiently emitted, and in addition, electrons emitted from an NEA surface are in an extremely small emission angle range of about 10 degrees or less, and a high-brightness electron source is obtained.

The excitation optical system 6 can irradiate a predetermined position of the photoelectric film 2 with the excitation light 5. For example, an emission position and an emission angle of light of the excitation light source 9 are set as predetermined conditions, and the excitation light 5 can be emitted to a predetermined position of the photoelectric film 2 in FIG. 1. The control unit 30 can set a position (the excitation point 8) at which the excitation light 5 is emitted to the photoelectric film 2 to be a predetermined position. Details of the excitation optical system 6 will be described later.

GaAs which is superior in high brightness characteristic is used as the photoelectric film 2. A GaAs photocathode has high brightness, and has an electron emission characteristic of being extremely sensitive to a surface state. When electrons are emitted from the photoelectric film 2, an electron beam collides with another member to generate an electron impact desorption gas, and when ions generated by the collision of the electrons with the electron impact desorption gas collide with a photoelectric surface, the NEA surface is damaged and an emission characteristic deteriorates. Therefore, when the GaAs photocathode is used as the photoelectric film 2, the vacuum chamber 40 in which the photoelectric film 2 is installed needs to be in an extremely high vacuum environment (typically, about $10^{-9}$ Pa or less). On the other hand, a maximum pressure of a sample chamber of a general-purpose electron microscope is about $10^{-3}$ Pa, and a pressure difference is large. In order to maintain an electron gun chamber in extremely high vacuum, it is required to connect an evacuation facility to a plurality of chambers between the electron gun 13 and a sample chamber, and it is required to provide a differential exhaust mechanism, that is, the differential exhaust diaphragm 4 having a small opening diameter in a partition wall of each chamber. In order to maintain a state of the NEA surface by creating extremely high vacuum around the electron gun 13, it is effective to use the differential exhaust diaphragm 4 having a smaller opening diameter or to increase a distance between the photoelectric film 2 and the differential exhaust diaphragm 4.

Here, in order to explain a problem in the case of using the differential exhaust diaphragm 4 having a smaller opening diameter, a structure of the electron gun 13 in the related art that uses the NEA surface is shown in FIGS. 3 and 4 for comparison. The one-stage anode electrode 11 is disposed in a manner of facing an electron emission surface of the photoelectric film 2. For example, the drawing shows a schematic diagram of a trajectory of the electron beam 7 generated from the excitation point 8 in a case where −1 kV (<0 V) is applied to the photoelectric film 2 serving as a case where the electron beam 7 having an emission energy of 1 keV is emitted to a sample at a ground potential. FIG. 3 shows a trajectory when the excitation point 8 is set on an optical axis, and FIG. 4 shows a trajectory when the excitation point 8 is set off-optical axis. In FIG. 3, the electron beam 7 from the optical axis is accelerated to have energy of 1 keV by a lens electric field formed between the photoelectric film 2 and the anode electrode 11, and most of the electron beam 7 passes through the differential exhaust diaphragm 4. On the other hand, in FIG. 4, the lens electric field after the electron beam 7 passes through the anode electrode 11 may contribute to a diverging action on the electron beam 7, and most of the electron beam 7 may be blocked by the differential exhaust diaphragm 4 having a small hole diameter.

In order to use the high-brightness NEA photocathode using the GaAs described above, as the opening diameter of the differential exhaust diaphragm 4 is reduced, differential exhaust performance can be improved, but an electron beam traveling outside the optical axis is likely to be blocked by the differential exhaust diaphragm 4 as shown in FIG. 4. Therefore, in the electron source using a photocathode, an excitation point that can be substantially used is limited to the vicinity of an optical axis, and characteristics of a planar electron source cannot be utilized.

On the other hand, in the first embodiment, the anode electrodes are implemented as two separate electrodes, and the first anode electrode 11 and the second anode electrode 12 are disposed in an order away from the photoelectric film 2 in a direction opposite to the substrate 1, as shown in FIGS. 1 and 2. The voltage $V_1$ applied to the first anode electrode 11 and the voltage $V_2$ applied the second anode electrode 12 are controlled in such an electrode arrangement. In the first embodiment, a voltage is applied such that the electron beam 7 emitted from the photoelectric film 2 is accelerated by the first anode electrode 11 and then is decelerated by the second anode electrode 12. That is, the voltage $V_1$ applied to the first anode electrode 11 is a positive voltage relative to the voltage $V_0$ applied to the photoelectric film 2, and the voltage $V_2$ applied to the second anode electrode 12 is a negative voltage relative to the voltage $V_1$ applied to the first anode electrode 11.

A case where a sample at a ground potential is irradiated with the electron beam 7 having an emission energy of 1 keV is described as a specific example, and FIGS. and 2 show schematic diagrams of a trajectory of an electron beam in a case where $V_0=-1$ kV (<0 V) is applied to the photoelectric film 2, $V_1=+3$ kV (>0 V) is applied to the first anode electrode 11, and the second anode electrode 12 is set to a ground potential ($V_2=0$ V). An optimum value of an applied voltage depends on an electrode configuration such as a distance between electrodes and a central opening diameter, and is not limited to the above values. According to the above configuration and control, not only in the case where the excitation point 8 is set on the optical axis but also in the case where the excitation point 8 is set off-optical axis, as shown in FIG. 2, the electron beam 7 is deflected once in the off-optical axis manner by being subjected to a diverging action of a lens electric field immediately after the electron beam 7 passes through the first anode electrode 11, but the electron beam 7 is deflected in a direction of an optical axis 15 by being subjected to a deflecting action and a converging action of a lens electric field formed between the first anode electrode 11 and the second anode electrode 12, and the electron beam 7 easily passes through the differential exhaust diaphragm 4. Therefore, even in a case where it is required to create extremely high vacuum as in a high-brightness NEA photocathode using GaAs, the electron beam 7 off-optical axis can be caused to pass through the differential exhaust diaphragm 4 in a wider range than that in the related art, and can be used.

The configuration in the first embodiment has the following additional advantages. When electrons in the electron beam 7 have a high density, a Coulomb repulsion force among the electrons are increased, and the electron beam 7 is subjected to a diverging action (a space charge effect). When the electron beam 7 is pulsed using the excitation light 5 as pulsed light, a large current is instantaneously emitted as compared with a case where a continuous light source is connected, and the space charge effect becomes more remarkable under a condition that a charge amount included in one pulse of the pulsed electron beam 7 is large. In general, the space charge effect becomes more remarkable under a condition that energy of the electron beam 7 is smaller, and therefore, the space charge effect of the electron beam 7 becomes remarkable in the vicinity of the photoelectric film 2 immediately after the electron beam 7 is emitted from the photoelectric film 2. In order to reduce this influence, an acceleration electric field acting on the electron beam 7 in the vicinity of the photoelectric film may be enhanced and the electron beam 7 may pass through the anode electrode in a high energy state. The electrode configuration in the first embodiment (FIGS. 1 and 2) is a configuration in which the electron beam 7 can be accelerated once in the vicinity of the photoelectric film 2 and then decelerated as described above, and an electric field intensity in the vicinity of the photoelectric film can be set to be large as compared with an electrode configuration in the related art (FIGS. 3 and 4), and an adverse effect of the space charge effect can be reduced. This effect is particularly effective because a high acceleration state can be achieved only in the vicinity of the photoelectric film in a case where it is required to irradiate a sample with the electron beam 7 at low acceleration energy.

In FIGS. 1 and 2, in order to simplify the description, the description has been made on the basis of an ideal condition in which all axes of components such as the first anode electrode 11, the second anode electrode 12, and the differential exhaust diaphragm 4 coincide with one another, but these axes do not completely coincide with one another in an electron gun actually manufactured. In addition, the electron beam 7 is deflected by an adverse effect of a disturbance magnetic field or the like. Under such a condition, an optimum value of a voltage value of the anode electrode for determining the lens electric field that causes the electron beam 7 to efficiently pass through the differential exhaust diaphragm 4 strictly changes for each excitation point, and may depend on an acceleration voltage, an irradiation position of the excitation light, and a position of the differential exhaust diaphragm. Therefore, when the irradiation position 8 of the excitation light 5 is changed, voltage values of the first anode electrode 11 and the second anode electrode 12 can be changed by the control unit 30.

A method of calculating and setting the optimum value of the voltage value of the anode electrode is not shown in the drawings, and it is possible to use a method in which a relationship between a position of a photoexcitation point on the photoelectric film and an optimum value of a voltage is stored in advance as a table and a table value is referred, a method in which a calculation formula indicating the relationship between the position of the photoexcitation point and the optimum value of the voltage is stored and the optimum value of the voltage value of the anode electrode is obtained by calculation, a method in which an amount of electron beams colliding with the differential exhaust diaphragm or an amount of electron beams passing through the differential exhaust diaphragm is monitored and the optimum value of the voltage is searched, or the like.

On the other hand, depending on an axial deviation state of the above-described components of the electron gun 13, an influence of an external magnetic field, and a distance from an optical axis to a photoexcitation position on the photoelectric film 2, even when the photoexcitation position is changed, the electron beam may pass through the differential exhaust diaphragm without colliding with the differential exhaust diaphragm or a collision amount may fall within an allowable range while a voltage value of the anode electrode is maintained constant. In this case, the photoexcitation position 8 can be changed while the voltage of the anode electrode is maintained constant.

In order to correct the influence of the axial deviation of the anode electrodes 11 and 12 and the differential exhaust diaphragm 4 due to a deflection field, a deflection electrode capable of forming a dipole field may be provided in an appropriate region between the photoelectric film 2 and the differential exhaust diaphragm 4 in the structure of the electron gun 13 shown in FIG. 1, and an optimum deflection field may be applied in accordance with an excitation point. The first anode electrode 11 and the second anode electrode 12 may have an electrode configuration in which the first anode electrode 11 and the second anode electrode 12 are axisymmetrically divided into a plurality of (for example, four or eight) parts, and an electrode configuration in which a deflection field can be superimposed on a lens field, a structure for voltage application, and a voltage control method may be used. Further, the first anode electrode 11 and the second anode electrode 12 may be divided into a plurality of parts in a radial direction. In the case of such an electrode configuration or the like, since a lens electrode and a deflection electrode can be used in combination, a compact electron gun can be implemented.

In the electron gun 13 shown in FIGS. 1 and 2, a photoelectric film capable of obtaining a high brightness characteristic in an extremely high vacuum environment is used as described above. In order to control the trajectory of the electron beam in the vicinity of the photoelectric film, it is also possible to use a magnetic field type lens or a deflector in principle, and in order to make the periphery of the photoelectric film in extremely high vacuum, it is required to heat a member around the photoelectric film to at least 100° C. or more in order to remove gas. Therefore, a magnetic field type lens or deflector is not preferable, and it is desired to use a configuration in which an electric field type lens or deflector is used. In the configuration shown in FIGS. 1 and 2, electrodes are used without using a magnetic field type lens or a deflector, and the configuration is suitable for a high-temperature heat treatment for creating extremely high vacuum.

Although GaAs is used as the photocathode photoelectric film 2 in the first embodiment, the photocathode photoelectric film 2 is not limited thereto.

It is possible to set a point off the optical axis of the photoelectric film 2 as an excitation point by mounting the electron gun 13 having the configuration described above on an electron microscope. Application such as providing a plurality of excitation points 8 on the photoelectric film 2, and controlling a position and a timing of excitation at the plurality of excitation points becomes possible. Application examples related to such an electron gun, an electron microscope, and a system thereof will be described in the following embodiments.

Second Embodiment

FIG. 5 shows a configuration of an electron gun according to a second embodiment. The control unit 30 has a function of controlling a position at which electrons are emitted (a photoexcitation point) when an electron beam is emitted by photoexcitation of a photoelectric film in a manner in which the position is changed with time, and further, the excitation optical system 6 is configured to photoexcite a plurality of points on the photoelectric film 2. The structure of the anode electrode of the electron gun 13 is the same as that in the first embodiment. A configuration different from that of the first embodiment will be described in detail below.

In FIG. 5, a plurality of light sources 91, 92, and the like and a multi-core optical fiber 60 in which end portions of a plurality of optical fibers 61, 62, and the like are bundled together in close proximity are provided as an excitation light source unit 9. One ends of the plurality of optical fibers 61, 62, and the like are respectively connected to the plurality of light sources 91, 92, and the like, and the other ends of the plurality of optical fibers 61, 62, and the like are disposed in a manner of facing the substrate 1, and light emitted from the optical fibers can be emitted to the photoelectric film 2. Further, the control unit 30 controls the selection of the light sources such as the light sources 91 and 92 (that is, a position of an excitation point) and a timing of light emission of a selected light source. The control unit 30 controls a position of excitation light (that is, the selection of the light sources) and the timing, so that light beams emitted from the light sources 91 and 92 and the like are sent to the optical fibers 61 and 62 and the like, and light beams are emitted from the ends portions of the optical fibers 61 and 62 and the like as excitation light 51 and 52. Then, a plurality of excitation points 81 and 82 and the like on the photoelectric film 2 are irradiated with the excitation light 51 and 52 to generate electron beams 71 and 72 and the like. As a result, the electron beams can be generated by a time control from a plurality of positions on the photoelectric film 2. In the second embodiment, the light sources 91, 92, and the like are pulsed light sources, and the pulsed electron beams 71, 72, and the like are controlled to be alternately generated as shown in FIG. 5.

Although FIG. 5 shows a case where there are two optical fibers for the sake of simplicity, the number of fibers may be three or more, and is not limited to two. The excitation light 51 and 52, and the like emitted from the end portions of the optical fibers 61 and 62, and the like are condensed on the photoelectric film 2 by the condenser lens 3. At this time, although at least one of the excitation light passes in the off-optical axis manner, a condensed light diameter on the photoelectric film 2 can be made equal to a condensed light diameter on the optical axis by using the condenser lens 3 as appropriate.

FIG. 6 shows a control method according to the second embodiment. In a case where there are two photoexcitation points on the photoelectric film 2, a temporal change in output intensities of the light sources 91 and 92 serving as excitation light sources is shown. In FIG. 6, a horizontal axis represents time (t), and a vertical axis represents output intensities $P_1$ and $P_2$ of the excitation light 51 and 52 emitted to the excitation points 81 and 82. Light pulses of the excitation light generated from the light sources 91 and 92 that are pulsed light sources are denoted by 501 and 502, and a control is performed so that timings at which the photoelectric film 2 is irradiated with the light pulses do not overlap with each other. When the excitation light is pulsed and emitted in this manner, timings at which the photoelectric film 2 is excited are discretized in time.

Regarding the output intensities 501 and 502 of the pulsed excitation light 51 and 52, a pulse condition such as a pulse width, a pulse interval, and a peak intensity is controlled by the control unit 30 and each of the pulsed light sources 91 and 92. Although a control example is described in a case where the same setting value is set for two excitation light sources in FIG. 6 in order to simplify the description, the number of the excitation light sources may be three or more, and the pulse condition is not limited to the above-described conditions.

FIG. 7 shows another configuration example of the excitation optical system for perform a timing control on an irradiation position of the excitation light 5 as another example of the second embodiment. In this configuration, the excitation optical system 6 includes the single excitation light source 9, a collimator lens 31, galvano mirrors 201 and 202, and the condenser lens 3. The excitation light 5 emitted from the single excitation light source 9 is converted into parallel light by the collimator lens 31, and then the irradiation position 8 on the photoelectric film 2 is time-controlled using the galvano mirrors 201 and 202. With regard to the galvano mirrors 201 and 202, in order to two-dimensionally and continuously scan the photoelectric film 2 with the excitation light 5, the control unit 30 changes an irradiation position and an angle of light emitted to the condenser lens 3 by the galvano mirror 201 in a vertical direction and the galvano mirror 202 in a horizontal direction. It is possible to prevent an increase in a condensed light diameter caused by light passing through the outside of an optical axis of the condenser lens 3, by incorporating a relay lens (not shown) on an optical path of the excitation light 5.

The excitation optical system that performs a timing control on a large number of excitation points 8 on the photoelectric film 2 is not limited to the above one, and a micromirror array, an acousto-optic element, or the like may be used.

In the electron gun 13 according to the second embodiment, deterioration of the photoelectric film 2 can be prevented by performing the control as described above. In general, when the strong excitation light 5 is condensed and continuously emitted to one point of the photoelectric film 2, a damaged layer may be formed in an active layer of the photoelectric film 2, and the electron emission characteristic may deteriorate. When the electron gun 13 using the photoelectric film 2 is applied to an electron microscope, it is usually required to continuously irradiate a certain point on the photoelectric film 2 with the excitation light 5 during sample observation, and deterioration of the electron emission characteristic due to the above factors, that is, deterioration of a brightness characteristic is a problem. When the excitation point 8 of the excitation light 5 condensed and emitted to the photoelectric film 2 are time-controlled to change the irradiation position of the excitation light with time as in the second embodiment, the above adverse effect can be prevented, and stability of the electron gun can be improved. That is, there are a plurality of excitation points on the photoelectric film 2, a damaged layer is less likely to be formed, deterioration of the electron emission characteristic is prevented, and stable electron beam emission with a long life becomes possible.

Third Embodiment

FIG. 8 shows a configuration of an electron gun according to a third embodiment. The third embodiment relates to a structure in which a deflector is added to the electron gun 13 according to the first and the second embodiments, and relates to a method of controlling an electron beam using the structure. In FIG. 8, a structure of the anode electrodes 11 and 12 of the electron gun 13 is the same as that in the first embodiment, and a method and a device configuration for performing a timing control on a plurality of excitation sources are the same as those in the second embodiment. Portions different from the first embodiment and the second embodiment will be described in detail below.

In the third embodiment, two stages of deflectors 401 and 402 parallel to an optical axis are disposed in a region between the second anode electrode 12 and the differential exhaust diaphragm 4 in FIG. 8. In this configuration, a control device (not shown) is disposed to deflect an electron beam off the optical axis generated from a photoexcitation point off the optical axis so as to return the electron beam onto the optical axis 15.

In order to explain an operation of the present embodiment, FIGS. 9 and 10 are schematic diagrams showing a trajectory of an electron beam in an SEM serving as a representative example of an electron beam device equipped with a general electron gun. The SEM is a device that irradiates a sample with an electron beam converged on the sample, as a probe. The electron beam 7 is generated from an emission point 85 (a virtual light source position) of an electron beam, passes through an electron optical system 700 including three stages of electron lenses 301 to 303, is reduced by the electron lenses, and is emitted to an irradiation position 95 on a sample 701. FIG. 9 shows a trajectory of an electron beam when the electron emission point 85 is set on the optical axis, and FIG. 10 shows a trajectory of an electron beam when the electron emission point 85 is set off-optical axis. Here, the electron lenses 301 to 303 may be of a magnetic field type or an electric field type. Although the electron lenses are provided in three stages, the invention is not limited thereto. Although an SEM is described as a representative example of an electron beam device in FIGS. 9 and 10, the same applies to a scanning transmission electron microscope (STEM) that irradiates a thinned sample with a converged probe electron beam in a similar manner to the SEM and detects the transmitted electron beam.

In the electron gun using the photoelectric film 2 as in the first to third embodiments, a virtual light source diameter is about the same as an irradiation spot diameter of the excitation light. Since the virtual light source diameter is far larger than a virtual light source diameter of a needle-shaped electron source in the related art, it is required to appropriately set the magnification (a reduction rate) of the electron optical system 700 so that the virtual light source diameter projected onto a sample does not limit resolution of an electron microscope.

In this case, as shown in FIG. 10, when a virtual light source position is set off-optical axis, the irradiation position 95 of the electron beam on the sample is off-optical axis, and the virtual light source position reaches a position different from that in a case where the electron beam is on the optical axis. When a distance (displacement) of an excitation point on the photoelectric film from the optical axis is $R_0$ and a total magnification of the electron optical system is M ($M_{total}$), a displacement of an electron beam arrival position on the sample is $M \times R_0$. When an acquisition condition of an SEM image is a sufficiently low magnification, a displacement amount $M \times R_0$ is sufficiently smaller than a pixel size of the SEM image, so that a deviation amount of the electron beam arrival position is not a problem. On the other hand, when the displacement amount $M \times R_0$ exceeds a pixel size under an acquisition condition of an SEM image at a high magnification, a pixel on the SEM image corresponding to the irradiation position 95 of the electron beam 7 on the sample changes with a displacement of an excitation point, and a position change becomes apparent on the image. In order to solve this problem, it is required to control the displacement amount to fall within one pixel in the electron optical system 700.

In order to solve this problem and prevent the irradiation position 95 of the electron beam 7 on the sample from being changed even when a position of the excitation point changes, the electron gun 13 shown in FIG. 8 can control a trajectory of an electron beam in the electron gun. As described above, the deflectors 401 and 402 are disposed between the second anode electrode 12 and the differential exhaust diaphragm 4, and the electron beam off-optical axis generated from a photoexcitation point off-optical axis is deflected so as to return to the optical axis 15. As a result, an influence of a displacement of the photoexcitation point on the irradiation position on the sample can be reduced even when observation is performed at a high magnification, and the displacement amount of the irradiation position 95 on the sample can be made to fall within one pixel. As a result, an electron optical system of the SEM (or STEM) at a sample side of an electron gun can control an electron beam in a similar manner to a case of a single excitation point even when an excitation point on the photoelectric surface 2 is changed.

At this time, each of the deflectors 401 and 402 preferably has an electrode configuration equally divided into four or eight parts in a radial direction. Although the same deflection control can be performed by using a deflector provided in the vicinity of the sample, there is a problem that the control becomes complicated because an irradiation angle of an electron beam changes depending on a position of an excitation point. Therefore, in order to minimize the control of the electron optical system along with the change of the excitation point, the configuration in the third embodiment in which a deflection control mechanism is mounted as close to a photoelectric surface side as possible is preferable.

After the deflection control mechanism is mounted, an electric field lens such as a bipotential lens or an Einzel lens (not shown) may be further disposed in the vicinity of the photoelectric surface 2 side relative to the differential exhaust diaphragm 4. When a convergence position of the electron beam 7 is set in the vicinity of the differential exhaust diaphragm 4 by adding the above-described lens, an amount of electrons colliding with the differential exhaust diaphragm 4 can be further reduced. Accordingly, an amount of an electron impact desorption gas generated when the electron beam 7 is not converged by the lens can be reduced, and thus an irradiation current can be further stabilized.

Fourth Embodiment

FIG. 11 shows a configuration of an SEM according to a fourth embodiment. In the fourth embodiment, the electron gun 13 according to any one of the first to third embodiments is mounted, the electron optical system 700 that converges an electron beam, scans a sample with the electron beam, and deflects the electron beam is provided, and the sample 701 is irradiated with the electron beam 7.

As described above, the SEM is a device that irradiates a sample with a converged electron beam while deflecting the electron beam as a probe electron beam. In FIG. 11, the electron gun 13 shown in any one of FIGS. 1 to 5, 7, and 8 is mounted. The electron beam 7 emitted from the second anode electrode 12 and the differential exhaust diaphragm 4 located downstream of the second anode electrode passes through the electron lenses 301 to 303 and a scanning coil 708 of the electron optical system 700, and is emitted onto the sample 701 while being converged, being made to scan the sample 701, and being deflected. Secondary electrons (not shown) and backscattered electrons 702 generated from the sample are respectively detected by a secondary electron detector 713 and a backscattered electron detector 703, and signals are processed by a signal processing unit 704 to create an image of the sample 701. The sample is placed on a sample stage 699. Further, the entire device has a configuration in which a plurality of differential exhaust diaphragms 4 are provided to perform differential exhaust, and evacuation is performed by evacuation systems 801 to 803 (ion pumps, NEG pumps, and the like). The device configuration shown in FIG. 11 is a typical example of an SEM, and the invention is not limited to this configuration. With regard to an arrangement of the electron lenses of the electron optical system, although an adjustment is performed by each lens using the three electron lenses in the present embodiment, the invention is not limited to such an arrangement.

With the SEM having such a configuration, even when the photoelectric film 2 having high brightness in a high vacuum state is used, the electron beam 7 generated from the outside of the optical axis of the photoelectric film 2 can pass through a wider electron beam range than that in the related art without being blocked by the differential exhaust diaphragm 4 disposed directly below the electron gun, and can be used for image observation of the sample 701, and brightness of the electron beam 7 can be increased. When the electron gun according to the third embodiment (FIG. 8) is used as the electron gun 13, a displacement of an irradiation position on the sample due to a displacement on the photoelectric film 2 can be made to fall within one pixel of an image even under an observation condition of a high magnification, and the electron beam can be controlled in a similar manner to the case of a single excitation point. Since the electron beams 7 from a plurality of excitation points on the photoelectric film 2 can be used, deterioration of the photoelectric film 2 does not occur even when the SEM is continuously used for a long period of time, and it is possible to stably observe a sample with high accuracy and with a long life.

A scanning transmission electron microscope (STEM) that irradiates a thinned sample with a converged probe electron beam in a similar manner to the SEM and detects the transmitted electron beam can also be controlled by a substantially similar electron optical system device. Although an SEM has been described as a representative example of an electron beam application device in the fourth embodiment, the same control can be performed in the STEM and can be applied to the STEM.

Fifth Embodiment

FIG. 12 shows a configuration according to a fifth embodiment. The fifth embodiment relates to a configuration, a control method, and an observation method of a device in which the electron gun 13 shown in any one of FIGS. 1 to 5, 7, and 8 is mounted on an SEM and a time control of an excitation point is performed. Specifically, an electron beam is generated from the outside of the optical axis of the photoelectric film 2, an incident angle of the electron beam to be emitted to a sample is changed and controlled by performing a predetermined control without returning the electron beam to the optical axis.

A device configuration in the fifth embodiment is basically the same as that of the fourth embodiment (FIG. 11). The electron gun 13 is the same as any one of the first to third embodiments, and a timing control method of an excitation light is the same as that of the second embodiment. In a case where the electron optical system 700 includes the three electron lenses 301, 302, and 303, a schematic diagram of a trajectory up to when the electron beam 7 emitted from a virtual light source 85 on the optical axis reaches a sample is the same as the trajectories shown in FIGS. 9 and 10. Hereinafter, differences from the first to fourth embodiments will be described in detail.

In the fifth embodiment, as described above, the electron beam is generated from the outside of the optical axis, the incident angle of the electron beam to be emitted to the sample is changed and controlled by performing the predetermined control without returning the electron beam to the optical axis. Therefore, in the present embodiment, a control of swinging back the electron beam emitted when a point off-optical axis is set as an excitation point to the optical axis as described in the third embodiment is not performed. The electron beam 7 that passed through the second anode electrode 12 is controlled to travel along a trajectory parallel to the optical axis by appropriately controlling the voltage applied to the second anode electrode 12.

FIG. 10 shows an irradiation angle of an electron beam on a sample, in which the electron beam is emitted from the photoelectric film 2 in parallel with the optical axis, when a displacement amount of the virtual light source 85 is $R_0$. In the electron optical system 700, a focal length of the electron lens 301 is $f_1$, a magnification of the electron lens 301 is $M_1$, a magnification of the electron lens 302 is $M_2$, and a magnification of the electron lens 303 is $M_3$. A magnification of the entire electron optical system is $M_{total} = M_1 \times M_2 \times M_3$. In a case where the virtual light source 85 and the electron lens 301 are sufficiently separated from each other, when an irradiation angle to the sample is calculated based on a lens formula, an irradiation angle $\theta_3$ to the sample is $\theta_3 = (R_0 \times M_1)/(f_1 \times M_{total})$ This formula is also effective when the number of lenses constituting the electron optical system is generalized to n ($M_{total} = M_1 \times M_2 \times \ldots \times M_n$). According to this formula, when the magnification (a reduction ratio) of the entire electron optical system is set to be fairly small ($M_{total} \ll 1$) such that a virtual light source diameter does not become apparent, the irradiation angle to the sample 701 can be set to be large when the displacement amount $R_0$ of the excitation source is slightly deviated. For example, in a case where $R_0 \approx 10$ μm, $f_1 \approx 10$ mm, and $M_1/M_{total} \approx 100$, the irradiation angle $\theta_3$ to the sample ≈ about 100 mrad.

As described above, according to the fifth embodiment, the irradiation angle to the sample can be controlled by controlling a position of the virtual light source. Three examples related to an observation method of an SEM or an STEM using this function will be described below.

In a first example, an electron channeling pattern (ECP) is acquired. An example of a device configuration for this purpose is the same as the above-described device configuration shown in FIG. 12. In this observation method, a certain point on the sample 701 is locked as a deflection fulcrum, an irradiation angle is changed, and signal electrons generated at each point are detected. In a normal SEM image, a detection signal intensity is mapped to an irradiation position (X, Y), while in the ECP, a detection signal intensity is mapped to an irradiation angle ($\theta_X$, $\theta_Y$). A detection signal in this case is targeted on the back scattered electrons (BSE) 702, and in order to efficiently detect the BSE, the BSE detector 703 such as a semiconductor detector is disposed between an objective lens (the third electron lens 303) and the sample 701.

In the fifth embodiment, since the irradiation angle of the electron beam 7 to the sample is changed by changing an excitation position on the photoelectric film 2, the same function can be obtained by mapping the detection signal intensity to coordinates ($X_{light}$, $Y_{light}$) of an excitation point. In this configuration, the coordinates of the excitation point are converted into an irradiation angle of an electron beam to a sample, and a signal processing for recording a detection signal intensity for each irradiation angle is performed by the signal processing unit 704. As a result, an obtained signal amount can be displayed as the ECP. When the ECP is acquired, since the irradiation angle of the electron beam is controlled by changing the excitation point, the scanning coil 708 is turned off to acquire a mapping image.

For a sample having crystallinity, the ECP obtained by the above method depends on a crystal orientation, and thus the ECP can be used as a method of identifying the crystal orientation. While a deflection control is performed by using a deflector in a normal SEM, since it is required to obtain the ECP by continuously changing the irradiation angle in the present embodiment, it is preferable to use a unit that continuously changes an excitation point, such as the galvano mirrors 201 and 202 described in the second embodiment (FIG. 7).

In order to identify the crystal orientation from the obtained ECP, when a database of ECPs of a representative sample is separately provided and a system for identifying a crystal orientation for each irradiation position is added, a mapping image of a crystal orientation on a sample surface can be obtained.

In a second example, a stereo image is acquired using an SEM. An example of a configuration of an observation device (SEM) for this purpose is the same as the device configuration in FIG. 12. An electron beam control method, a signal processing method, and the like are as follows, and are different from the case of acquiring the ECP. A stereo observation is a method of three-dimensionally observing a sample using parallax, an SEM image is acquired by inclining an electron beam at two irradiation angles (directions), and three-dimensional information on the sample is reconstructed from two observation images. In a normal stereo observation, it is required to control a deflector in a complicated manner, whereas in the present embodiment, it is possible to obtain a stereo observation image by controlling an irradiation angle (a direction) by performing a timing control on positions of the excitation points 8 on the photoelectric film 2. In this configuration and control, since it is not required to continuously perform scanning using excitation light, it is preferable to use an excitation optical system capable of exciting two different excitation points (hereinafter, referred to as an excitation point A and an excitation point B) using the multi-core optical fiber 60 shown in FIG. 5.

In the stereo observation, the configuration includes a signal processing unit that separately records a signal intensity obtained by scanning the sample 701 with the electron beam 7 emitted from the excitation point A and a signal intensity obtained by scanning the sample 701 with the electron beam 7 emitted from the excitation point B, and the signal processing unit 704 that performs a signal processing required for obtaining a stereo SEM image from an obtained signal amount.

For example, when a stereo SEM observation is applied to a pyramid-shaped sample, FIGS. 13A and 13B show schematic diagrams in a case where an SEM image is acquired using inclined electron beams of $\theta=\theta_-$ and $\theta=\theta_+$. An inclination angle of an electron beam is required to be about $\theta=5$ deg. FIGS. 14A and 14B show observation examples in a case where an SEM image of a pyramid-shaped sample is obtained using inclined electron beams of $\theta=\theta_-$ and $\theta=\theta_+$. A three-dimensionally visible observation image is displayed on a screen (not shown) by processing the obtained SEM image. In the case of obtaining a stereo SEM image, a basic inclination angle (a direction) of the electron beam 7 is controlled by changing the excitation point 8, and then the sample 701 is scanned with inclined electron beams using a scanning coil, thereby obtaining an SEM image corresponding to each inclination angle (direction).

In a third example, a hollow cone illumination is used. A configuration example of such a device is shown in FIG. 15. The electron gun 13 according to any one of the first to third embodiments is mounted on a STEM. The sample 701 is irradiated with the electron beam 7, and electrons transmitted through the sample 701 are detected and imaged on a fluorescent screen 723 via electron lenses 304 and 305 located downstream of the sample.

In the hollow cone illumination method, a certain point on the sample is irradiated with an electron beam at an angle (in a direction). When an electron beam diffraction pattern is obtained by a hollow cone irradiation, a high-order diffraction pattern is obtained in a sample having crystallinity, and thus identification accuracy of a crystal orientation can be improved. The signal processing unit 704 and the control unit 30 have a function of superimposing and displaying diffraction patterns acquired by changing an irradiation angle (a direction). When obtaining a diffraction pattern, an inclination angle (a direction) of an electron beam is controlled by changing the photoexcitation point 8 on the photoelectric film 2, the scanning coil 708 is turned off, and the diffraction pattern is obtained by the fluorescent screen 723.

A normal diffraction pattern is obtained by irradiating a sample with an electron beam parallel to the optical axis and enlarging and projecting a diffraction spot formed on a back focal plane of an objective lens below the sample using a projection lens. In a similar electron optical system, when an electron beam converged on a sample is emitted, spots having an area are observed. Since a distribution of the obtained spots reflects crystallinity of the sample, the distribution can be used for analyzing a crystal orientation in a similar manner to that of a normal diffraction pattern. Further, a higher order diffraction pattern can be obtained by performing the hollow cone illumination.

FIG. 16 shows another configuration example of a device using the hollow cone illumination. In order to make it easy for a diffracted electron beam having a large irradiation angle to reach the fluorescent screen 723 after passing through the sample 701, a deflection coil 709 for swing-back is added to the configuration shown in FIG. 15 at a screen side relative to the sample 701 in FIG. 16.

Sixth Embodiment

FIGS. 17 to 19 show a configuration according to a sixth embodiment. In the sixth embodiment, a spin direction of the emitted electron beam 7 is controlled by the electron gun 13 using a predetermined photocathode.

First, a control of a spin direction of the electron beam and the photocathode will be described. When the photoelectric film 2 has a distorted superlattice structure of GaAs and GaAsP, degeneracy of energy levels of an upward spin and a downward spin is resolved by the distortion of a crystal structure. When such a photoelectric film 2 is irradiated with circularly polarized light having an appropriate wavelength corresponding to gap energy of the superlattice, electrons having a spin in one direction are selectively excited and emitted. This phenomenon is used to control an irradiation position, an irradiation time, and a direction of the circularly polarized light of excitation light emitted to the photoelectric film, so that a spin direction of an electron beam can be controlled, and a spin-polarized image of an electron microscope can be acquired.

FIG. 17 shows a configuration example of an excitation optical system of a photocathode for controlling a spin direction of an electron beam and the photocathode. Specifically, the excitation optical system irradiates the photoelectric film 2 with the circularly polarized excitation light 51 and 52 in mutually opposite directions. The excitation light source unit 9 is formed based on a configuration using the multi-core optical fiber 60 shown in FIG. 5. The excitation optical system 6 includes a plurality of light sources 93 and 94, the multi-core optical fiber 60, a plurality of optical fibers 61 and 62, the collimator lens 31, a quarter-wavelength plate 32, and the condenser lens 3.

A fact that a linearly polarized light beam becomes a circularly polarized light beam when the linearly polarized light beam passes through the quarter-wavelength plate 32 is used, linearly polarized light beams are generated from the light sources 93 and 94, and end portions of the optical fibers 61 and 62 are appropriately disposed, so that linearly polarized light beams are emitted from the end portions of the optical fibers in directions orthogonal to each other (in a paper surface in-plane direction and in a direction perpendicular to the paper surface), and the linearly polarized light beams pass through the quarter-wavelength plate 32, thereby generating circularly polarized light beams in mutually opposite directions. Specifically, there is a method in which linearly polarized light beams orthogonal to each other are generated by the light sources 93 and 94, the linearly polarized light beams are incident on the optical fibers (for example, polarization maintaining optical fibers) 61 and 62 capable of maintaining respective polarization directions of the linearly polarized light beams, and the end portions of the optical fibers 61 and 62 are arranged such that the polarization directions of the linearly polarized light beams at emission end portions of the optical fibers 61 and become predetermined directions, a method in which linearly polarized light beams identical to each other are generated by the light sources 93 and 94, the linearly polarized light beams are incident on the optical fibers 61 and 62 capable of maintaining the polarization directions of the linearly polarized light beams, and the end portions of the optical fibers 61 and 62 are arranged such that the polarization directions of the linearly polarized light beams at the emission end portions of the optical fibers 61 and 62 become orthogonal to each other, or the like.

As a result, circularly polarized excitation light in mutually opposite directions are generated, and are emitted to different excitation points 81 and 82 on the photoelectric film 2. For example, the excitation light 51 and 52 emitted to the excitation points 81 and 82 are respectively a left-handed circularly polarized light beam and a right-handed circularly polarized light beam. As a result, electron beams having spins in mutually opposite directions are emitted from the excitation points 81 and 82.

It is difficult to switch circularly polarized light beams having different rotation directions at high speed by a single excitation light source. On the other hand, circularly polarized light beams having different rotation directions can be generated in advance by disposing separate light sources and optical fibers in this configuration, so that circularly polarized light beams having different rotation directions can be switched and used at high speed by a control unit (not shown).

FIG. 18 shows a configuration of an electron beam device using the excitation optical system shown in FIG. 17. The electron beams 71 and 72 having spins in mutually opposite directions are emitted from the excitation points 81 and 82 on the photoelectric film 2 irradiated with the circularly polarized excitation light 51 and 52 in mutually opposite directions. The backscattered electrons 702 generated at the irradiation position 95 on the sample 701 are detected using the backscattered electron detector 703. An E-T type electron detector using a scintillator on a sensing surface, a semiconductor detector, or the like is used as the detector 703. A detector having a single sensing surface is used and a detection signal is time-divided to calculate a signal when an electron beam having an upward spin is emitted and a signal when an electron beam having a downward spin is emitted using the signal processing unit 704.

It is known that a spin interaction is significantly smaller than the Coulomb interaction. Therefore, it is possible to emphasize and display a contrast of extremely small spin polarizations by performing the following signal calculation processing and mapping a signal intensity. In the detector 703, an image in which a spin polarization of a sample is mapped can be acquired by performing a signal calculation of $P=(I_\uparrow - I_\downarrow)/(I_\uparrow + I_\downarrow)$ in each pixel, in which a signal intensity when the electron beam having the upward spin is emitted is represented by $I_\uparrow$ and a signal intensity when the electron beam having the downward spin is emitted is represented by $I_\downarrow$.

A timing of switching between the upward spin and the downward spin considers a procedure of acquiring a mapping image using a spin-polarized electron beam that firstly has an upward spin and thereafter has a downward spin, and since a spin interaction is weak, it is required to lengthen a pixel stay time by 10 times or more of a normal SEM image, and a necessary contrast may not be obtained due to a factor such as contamination adhesion accompanying with the emission of an electron beam. Therefore, it is preferable that a spin direction is switched for each pixel of the SEM or for each line to detect a signal.

With the above device configuration and control, the spin polarization in a sample surface perpendicular direction (a direction perpendicular to a sample surface (a Z direction)) can be analyzed.

Next, FIG. 19 shows another configuration example of a device that controls a spin of an electron beam and irradiates a sample with the electron beam. A spin rotator 705 is added to the device configuration shown in FIG. 18.

As a magnetic analysis method of the sample 701, it is possible to analyze the spin polarization in the direction (Z direction) perpendicular to the sample surface in the device configuration shown in FIG. 18, and further, in order to enable analysis of a spin polarization in X and Y directions, the spin rotator 705 is installed in a region between the sample 701 and the photoelectric film 2.

The spin rotator 705 is a so-called Wien filter configured such that an electric field deflection field and a magnetic field deflection field are orthogonal to each other and superimposed on each other. When an electron beam passes through the magnetic field deflection field, a traveling direction of the electron beam is bent, a spin direction of electrons is changed, and the spin direction is rotated so as to perform a precession relative to a deflection magnetic field. Since a spin rotation amount depends on an applied magnetic field strength and a length of an applied region of the deflection field through which the electron beam passes, the spin rotation amount can be controlled by controlling a deflection magnetic field strength. On the other hand, as the electron beam passes through the deflection magnetic field, the electron beam is deflected in the off-axis manner. In order to prevent the electron beam from being deflected in the off-axis manner, an electric field deflection field is applied in a manner of being orthogonal to the magnetic field deflection field, and a deflection strength is controlled such that the electron beam travels straight. The spin direction of the electron beam can be changed from an optical axis direction (the Z direction) to a horizontal direction (the X direction and the Y direction) by applying an appropriate electromagnetic field in accordance with an emission energy of the electron beam. By devising an electromagnetic pole arrangement for applying a deflection field, the spin rotators 705 for changing a spin in the Z direction of an electron beam emitted from the photoelectric film 2 to a spin in the X direction and a spin the Y direction can be installed in the same region on an optical axis of an electron microscope. With such a configuration, the same signal calculation processing as described above can be performed in each of the X, Y, and Z directions, and a mapping image of a spin polarization in each of the X, Y, and Z directions can be obtained. As a result, versatility as an analysis method of a magnetic sample can be improved.

Although the invention made by the present inventors has been specifically described based on the embodiments, the invention is not limited thereto, and various modifications can be made without departing from the scope of the invention. For example, although an example of a scanning electron microscope (SEM) has been mainly described as an example of an electron microscope, the invention can be applied to various electron beam application devices such as a transmission electron microscope (TEM) and a scanning transmission electron microscope (STEM). The electron beam application device is limited to an electron beam application device including an electron detector that detects electrons (secondary electrons, reflected electrons, and the like) generated by emitting an electron beam, and may include another detector such as a detector that detects a characteristic X-ray. The electron beam application device can be applied not only to an electron microscope but also to a semiconductor exposure device using an electron beam.

Although a surface of the photoelectric film 2 irradiated with the excitation light 5 is opposite to a surface on which the electron beam 7 is generated (at a substrate 1 side) in the embodiments described above, the invention is not limited thereto. The excitation light 5 may be generated and controlled on a generation surface side of the electron beam 7 on the photoelectric film 2 and may be emitted from the generation surface side of the electron beam 7.

REFERENCE SIGNS LIST 1 transparent substrate
2 photoelectric film
3 condenser lens
4 differential exhaust diaphragm
5 excitation light
6 excitation optical system
7 electron beam
8 photoexcitation point
9 excitation light source
10 viewing port
11 first anode electrode
12 second anode electrode
13 electron gun
15 optical axis
20 voltage power supply applied to photoelectric film
21 voltage power supply applied to first anode electrode
22 voltage power supply applied to second anode electrode
30 control unit
31 collimator lens
32 quarter-wavelength plate
40 vacuum chamber
51, 52 excitation light
60 multi-core optical fiber
61, 62 optical fiber
71, 72 electron beam
81, 82 photoexcitation point
85 virtual light source
91, 92, 93, 94 light source
95 irradiation position of electrons on sample
201, 202 galvano mirror
301, 302, 303, 304, 305 electron lens of electron optical system
401, 402 deflector
501, 502 optical pulse intensity
699 sample stage
700 electron optical system
701 sample
702 backscattered electron
703 backscattered electron detector
704 signal processing unit
705 spin rotator (Wien filter)
708 scanning coil
709 swing back coil
711 pyramid-shaped sample
713 secondary electron detector
723 fluorescent screen
801, 802, 803 evacuation system (ion pump, NEG pump, and the like)
901, 902 inclined beam
911, 912 SEM image obtained using inclined beam

The invention claimed is:

1. An electron gun comprising:
a photocathode that has a substrate and a photoelectric film formed on the substrate;
a condenser lens configured to condense, onto the photoelectric film, excitation light emitted to the photoelectric film of the photocathode;
a first anode electrode and a second anode electrode that are arranged in an order away from the photoelectric film of the photocathode in a direction opposite to the substrate, wherein a first voltage that is positive relative to the photoelectric film of the photocathode is applied to the first anode electrode, and a second voltage that is negative relative to the first anode electrode is applied to the second anode electrode; and
an excitation optical system that includes the condenser lens and is configured to condense the excitation light on the photoelectric film, wherein:
the photocathode, the condenser lens, and the first and the second anode electrodes are disposed in a vacuum chamber in which a differential exhaust diaphragm is provided, and
the first voltage and the second voltage are controlled such that an electron beam emitted from a position of the photoelectric film on which the excitation light is condensed by the excitation optical system passes through the differential exhaust diaphragm.

2. The electron gun according to claim 1, wherein the position of the photoelectric film on which the excitation light is condensed by the excitation optical system is changeable.

3. The electron gun according to claim 2, further comprising:
a deflector configured to deflect the electron beam, wherein
a deflection amount in the deflector is controlled such that electron beams emitted from different positions of the photoelectric film pass along an optical axis at a position of the differential exhaust diaphragm.

4. The electron gun according to claim 1, wherein the first anode electrode and the second anode electrode are axisymmetrically divided into a plurality of parts.

5. An electron microscope comprising:
a vacuum chamber in which a differential exhaust diaphragm is provided;
an electron optical system disposed in the vacuum chamber and configured to irradiate a sample with an electron beam that is emitted from an electron gun and passes through the differential exhaust diaphragm;
a detector configured to detect charged particles generated by irradiating the sample with the electron beam;
a signal processing unit configured to process a signal detected by the detector; and
a control unit, wherein
the electron gun includes a photocathode that has a substrate and a photoelectric film formed on the substrate, a condenser lens configured to condense, onto the photoelectric film, excitation light emitted to the photoelectric film of the photocathode, and a first anode electrode and a second anode electrode that are arranged in an order away from the photoelectric film of the photocathode in a direction opposite to the substrate, and the control unit controls a position at which the excitation light is condensed on the photoelectric film, and controls a voltage applied to the first anode electrode and a voltage applied to the second anode electrode such that an electron beam emitted from the position of the photoelectric film at which the excitation light is condensed passes through the differential exhaust diaphragm.

6. The electron microscope according to claim 5, wherein the control unit controls to apply a first voltage that is positive relative to the photoelectric film of the photocathode to the first anode electrode and apply a second voltage that is negative relative to the first anode electrode to the second anode electrode.

7. The electron microscope according to claim 5, further comprising:

an excitation light source including a plurality of light sources configured to generate the excitation light and a plurality of optical fibers of which one ends are respectively connected to the plurality of light sources, wherein the other ends of the plurality of optical fibers are disposed in a manner of facing the substrate of the photocathode, and the control unit controls selection of the plurality of light sources and a timing of light irradiation of a selected light source.

8. The electron microscope according to claim 7, further comprising:

a quarter-wavelength plate provided between the excitation light source and the condenser lens, wherein the plurality of light sources of the excitation light source include a first light source configured to generate excitation light having first linearly polarized light and a second light source configured to generate excitation light having second linearly polarized light, and the plurality of optical fibers of the excitation light source include a first optical fiber disposed in a manner of receiving incident excitation light having the first linearly polarized light and emitting excitation light having first emission side linearly polarized light, and a second optical fiber disposed in a manner of receiving incident excitation light having the second linearly polarized light and emitting excitation light having second emission side linearly polarized light orthogonal to the first emission side linearly polarized light.

9. The electron microscope according to claim 8, wherein the excitation light from the first light source is condensed on the photoelectric film to emit a first electron beam having a spin in a first direction, and the excitation light from the second light source is condensed on the photoelectric film to emit a second electron beam having a spin in a second direction opposite to the spin in the first direction, the control unit switches the first light source and the second light source to irradiate the sample with the first electron beam and the second electron beam, the detector detects charged particles generated from the sample by emission of the first electron beam and the second electron beam, and the signal processing unit generates a signal indicating a spin polarization of the sample based on the signal detected by the detector.

10. The electron microscope according to claim 5, further comprising:

an excitation light source configured to generate the excitation light, and an optical mirror provided between the excitation light source and the condenser lens, wherein the control unit controls a position at which the excitation light is condensed on the photoelectric film by changing a position and an angle at which the excitation light is incident on the condenser lens using the optical mirror.

11. The electron microscope according to claim 5, wherein the control unit controls an irradiation angle of the electron beam to the sample by controlling the position at which the excitation light is condensed on the photoelectric film.

12. The electron microscope according to claim 11, wherein the control unit controls the irradiation angle of the electron beam to the sample to be a plurality of angles by controlling the position at which the excitation light is condensed on the photoelectric film to be a plurality of positions at a predetermined position on the sample, the detector detects charged particles generated from the sample by emission of the electron beam, and the signal processing unit generates an electron channeling pattern of the sample based on the signal detected by the detector.

13. The electron microscope according to claim 11, wherein the control unit controls an irradiation direction of the electron beam to the sample to be two or more directions by controlling the position at which the excitation light is condensed on the photoelectric film to be two or more positions, the detector detects charged particles generated from the sample by emission of the electron beam, and the signal processing unit generates an observation image of the sample from the two or more directions based on the signal detected by the detector.

14. The electron microscope according to claim 11, wherein the control unit controls an irradiation angle of the electron beam to the sample by controlling the position at which the excitation light is condensed on the photoelectric film, the detector detects transmitted charged particles generated from the sample by emission of the electron beam, and the signal processing unit generates an electron beam diffraction pattern of the sample based on the signal detected by the detector.

* * * * *